(12) United States Patent
Sugimura et al.

(10) Patent No.: US 7,547,968 B2
(45) Date of Patent: Jun. 16, 2009

(54) SEMICONDUCTOR DEVICE

(75) Inventors: Takahiro Sugimura, Tokyo (JP); Satoshi Imasu, Tokyo (JP); Norihiko Sugita, Tokyo (JP); Takafumi Betsui, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 374 days.

(21) Appl. No.: 11/434,745

(22) Filed: May 17, 2006

(65) Prior Publication Data

US 2006/0264022 A1    Nov. 23, 2006

(30) Foreign Application Priority Data

May 17, 2005    (JP) .............................. 2005-143402

(51) Int. Cl.
*H01L 23/48* (2006.01)
*H01L 23/52* (2006.01)
*H01L 29/40* (2006.01)

(52) U.S. Cl. .................. 257/738; 257/686; 257/737; 29/740; 29/831

(58) Field of Classification Search ................ 257/686, 257/737, 738, 778; 29/740, 831, 840
See application file for complete search history.

(56) References Cited

U.S. PATENT DOCUMENTS

| | | | |
|---|---|---|---|
| 6,546,620 B1 * | 4/2003 | Juskey et al. .................. 29/840 |
| 6,800,945 B2 | 10/2004 | Naka et al. |
| 7,091,620 B2 * | 8/2006 | Miyazaki et al. ............. 257/778 |
| 7,247,932 B1 * | 7/2007 | Lin et al. ...................... 257/686 |
| 7,294,927 B2 * | 11/2007 | Takahashi .................... 257/724 |
| 2002/0145204 A1 | 10/2002 | Naka et al. |
| 2005/0029673 A1 | 2/2005 | Naka et al. |

FOREIGN PATENT DOCUMENTS

| JP | 2002-305285 | 10/2002 |
|---|---|---|
| JP | 2003-282811 | 10/2003 |

* cited by examiner

*Primary Examiner*—Phuc T Dang
(74) *Attorney, Agent, or Firm*—Mattingly & Malur, PC

(57) ABSTRACT

The reliability of a semiconductor device which has the semiconductor components which were mounted on the same surface of the same substrate via the bump electrodes with which height differs, and with which package structure differs is improved. Semiconductor component 2 of WPP structure is mounted on the main surface of the interposer substrate which forms a semiconductor device via a plurality of bump electrodes. Semiconductor component 3 of CSP structure is mounted on the main surface of an interposer substrate via a plurality of bump electrodes with larger diameter and contiguity pitch than the above-mentioned bump electrode. And under-filling 4a and 4b mutually different, are filled up between the facing surfaces of this interposer substrate and semiconductor components 2, and between the facing surfaces of the interposer substrate and semiconductor components 3, respectively.

8 Claims, 10 Drawing Sheets

SEMICONDUCTOR DEVICE

CROSS-REFERENCE TO RELATED APPLICATION

The present application claims priority from Japanese patent application No. 2005-143402 filed on May 17, 2005, the content of which is hereby incorporated by reference into this application.

1. Field of the Invention

The present invention relates to semiconductor device technology, and particularly relates to semiconductor assembling technology.

2. Description of the Background Art

About semiconductor assembling technology, for example in paragraph 0005 of Japanese Unexamined Patent Publication No. 2003-282811 (refer to Patent Reference 1), the semiconductor mounting module configuration where a semiconductor bear chip, and a semiconductor component with ball grid array terminals are mounted on the same surface of the same wiring board, thermosetting resin is made to intervene between the facing surfaces of the above-mentioned semiconductor bear chip and the wiring board, and resin is poured between the facing surfaces of the above-mentioned semiconductor component and the wiring board is disclosed.

For example, in paragraph 0055 of Japanese Unexamined Patent Publication No. 2002-305285 (refer to Patent Reference 2), the MCM (multi-chip module) structure where a WPP (wafer process package) semiconductor element and a CSP (chip-size package) semiconductor element are mounted on the same surface of the same substrate, and under-filling is formed only between the WPP semiconductor element and the substrate is disclosed.

[Patent Reference 1] Japanese Unexamined Patent Publication No. 2003-282811 (paragraph 0005, FIG. 8 (e))

[Patent Reference 2] Japanese Unexamined Patent Publication No. 2002-305285 (paragraph 0055, FIG. 16, and FIG. 17)

SUMMARY OF THE INVENTION

By the way, the present inventors examined the assembling technology of semiconductor products which builds one system as a whole by mounting the semiconductor component of WPP structure with which the microprocessor was formed, and the semiconductor components of CSP structure with which the memory was formed on the same surface of the same substrate. The following is the technology examined by the present inventors and the outline of it is as follows.

A plurality of bump electrodes are arranged via the wiring layer and the rewiring layer on the main surface of the semiconductor chip, and the semiconductor components of the WPP structure which the present inventor considered are mounted on the above-mentioned substrate via the bump electrodes. In this case, since the contiguity pitch and diameter of the plurality of bump electrodes are small, an insulating resin called under-filling is made to intervene between the semiconductor component and the substrate from a viewpoint of securing reliability.

On the other hand, the semiconductor components of the above-mentioned CSP structure have the structure by which the semiconductor chip mounted on the wiring substrate was sealed with resin, and are mounted in the above-mentioned substrate via a plurality of bump electrodes arranged on the electrode formation surface of the wiring substrate. In this case, since the contiguity pitch and diameter of a plurality of bump electrodes are large compared with the contiguity pitch and diameter of a plurality of bump electrodes of semiconductor components of the above-mentioned WPP structure, they are not making under-filling intervene between semiconductor components and a substrate generally.

However, when the above-mentioned semiconductor products are accommodated in the socket for a test and the lid of the socket for a test is shut, for example in the screening test of the above-mentioned semiconductor products, a big load is applied to the bump electrode of the semiconductor components of CSP structure as a result of pushing the semiconductor components of relatively high CSP structure with the above-mentioned lid strongly in the upper surface. Although there is also the structure where a radiator is contacted on each upper surface of the semiconductor components of CSP structure and the semiconductor components of WPP structure as heat radiation structure of the above-mentioned semiconductor products, and is suppressed, a big load is applied to the bump electrode of the semiconductor components of relatively high CSP structure also in the case.

In the heat cycle test of the above-mentioned semiconductor products, with the semiconductor components of CSP structure, as a result of originating in the thermal expansion coefficient difference of component parts and a stress's concentrating on a bump electrode, there is also a problem that damage generates in a bump electrode or a disconnection failure generates in the wiring of the substrate opposite to this. Since the calorific value at the time of the operation is higher than the semiconductor components of WPP structure, the semiconductor components of CSP structure with which the memory is formed tend to generate problems, such as damage to a bump electrode, a wiring disconnection failure, etc. resulting from the above-mentioned stress.

Then, the present inventors poured in the same under-filling as under-filling which intervenes between the semiconductor components of WPP structure, and the substrate between the semiconductor components of CSP structure, and the substrate, in order to secure the reliability of the bump electrode of the semiconductor components of CSP structure. However, it was found out that the problem of the so-called solder flush that under-filling between the semiconductor components of CSP structure and the substrate peels from the semiconductor components of CSP structure, the bump electrode material flows through the stripping part, and a short circuit defect generates between adjoining bump electrodes occurred in that case.

Then, a purpose of the present invention is to offer the technology which can improve the reliability of the semiconductor device which has the semiconductor components which were mounted on the same surface of the same substrate via the bump electrodes with which height differs, and with which package structure differs.

The above-described and the other purposes and novel features of the present invention will become apparent from the description herein and accompanying drawings.

Of the inventions disclosed in the present application, typical one will next be summarized briefly.

That is, the present invention makes different under-filling between a substrate and each semiconductor component intervene in the semiconductor device which has the semiconductor components which were mounted on the first surface of the substrate via the bump electrodes with which height differs, and with which package structure differs.

Advantages achieved by some of the most typical aspects of the invention disclosed in the present application will be briefly described below.

Namely, in the semiconductor device which has the semiconductor components which were mounted on the first surface of a substrate via the bump electrodes with which height differs, and with which package structure differs, the reliability of the semiconductor device can be improved by having made different under-filling between the substrate and each semiconductor component intervene.

DETAILED DESCRIPTION OF THE PREFERRED EMBODIMENTS

Figure 1:
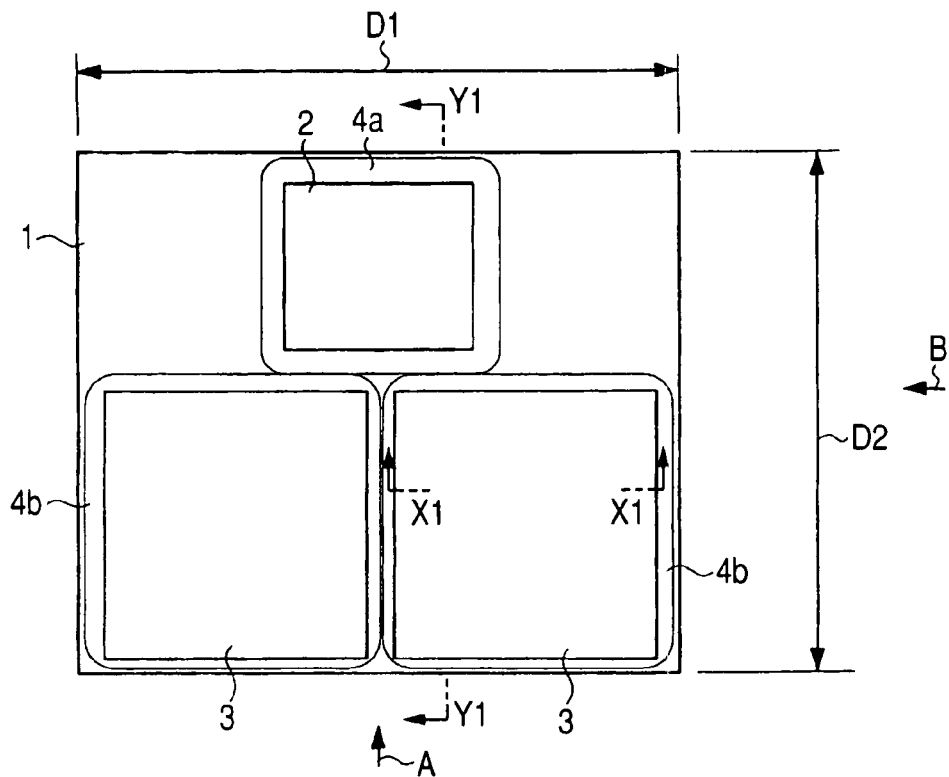
FIG. 1 is the whole main surface (first surface) plan view of the semiconductor device which is one of the embodiment of the present invention.

In the below-described embodiments, a description will be made after divided into plural sections or in plural embodiments if necessary for convenience sake. These plural sections or embodiments are not independent each other, but in relation such that one is a modification example, details or complementary description of a part or whole of the other one unless otherwise specifically indicated. And, in the below-described embodiments, when a reference is made to the number of elements (including the number, value, amount and range), the number is not limited to a specific number but may be equal to or greater than or less than the specific number, unless otherwise specifically indicated or principally apparent that the number is limited to the specific number. Furthermore, in the below-described embodiments, it is needless to say that the constituting elements (including element steps) are not always essential unless otherwise specifically indicated or principally apparent that they are essential. Similarly, in the below-described embodiments, when a reference is made to the shape or positional relationship of the constituting elements, that substantially analogous or similar to it is also embraced unless otherwise specifically indicated or principally apparent that it is not. This also applies to the above-described value and range. And, in all the drawings for describing the embodiments, members of a like function will be identified by like reference numerals and overlapping descriptions will be omitted as much as possible. Hereafter, embodiments of the invention are explained in detail based on drawings.

Figure 2:
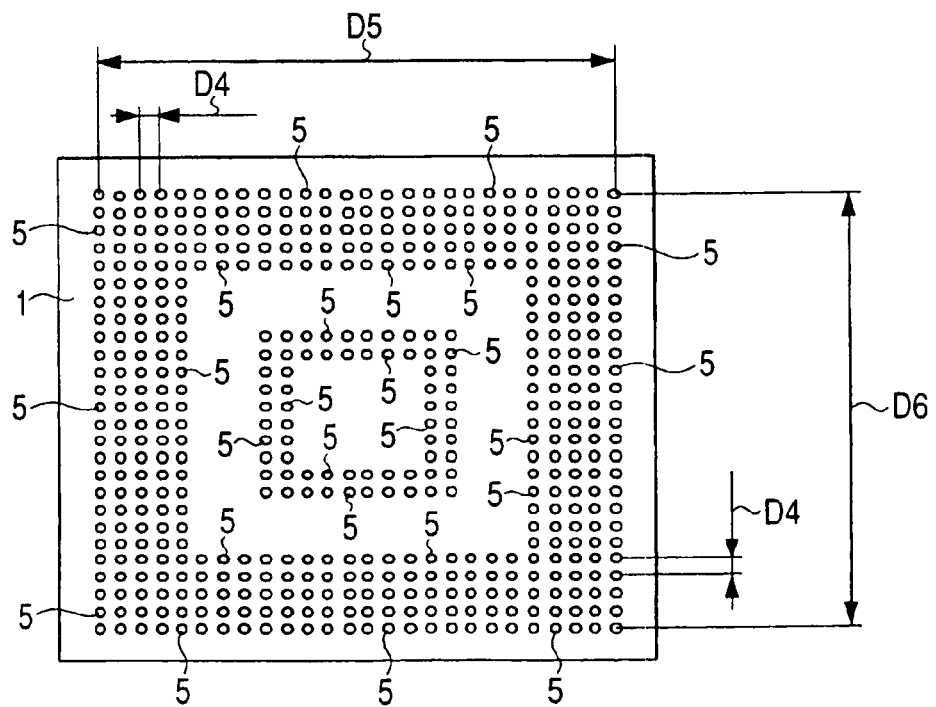
FIG. 2 is the whole back surface (second surface) plan view of the semiconductor device of FIG. 1.
Figure 3:
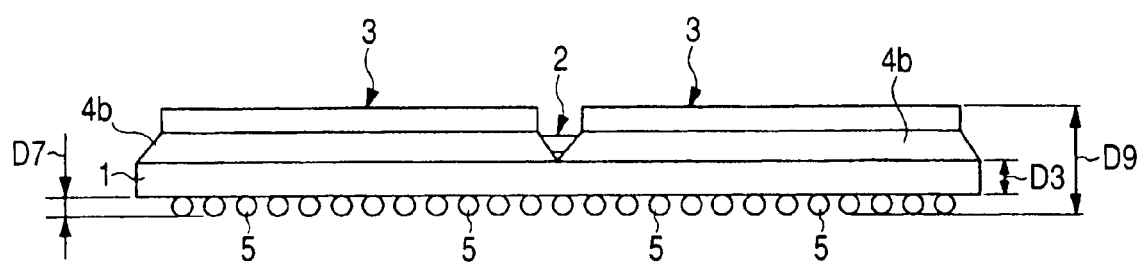
FIG. 3 is the side view which observed the semiconductor device of FIG. 1 from the direction of arrow A of FIG. 1.
Figure 4:
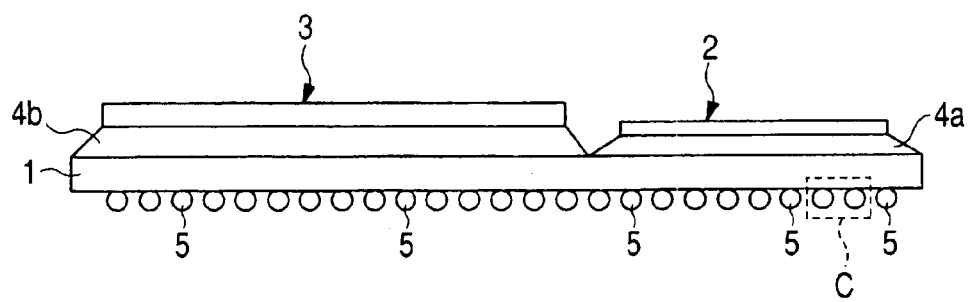
FIG. 4 is the side view which observed the semiconductor device of FIG. 1 from the direction of arrow B of FIG. 1.
Figure 5:
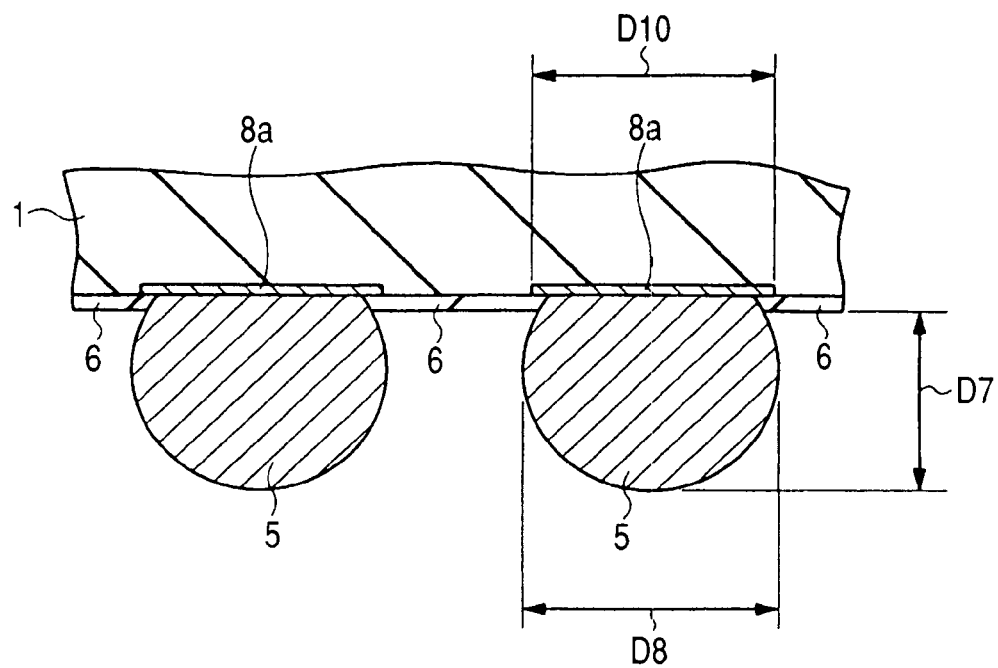
FIG. 5 is an enlarged sectional view of region C of FIG. 4.

FIG. 1 is the whole main surface plan view of the semiconductor device of this embodiment, and FIG. 2 is the whole back surface plan view of the semiconductor device of FIG. 1. FIG. 3 is the side view which observed the semiconductor device of FIG. 1 from the direction of arrow A of FIG. 1, FIG. 4 is the side view which observed the semiconductor device of FIG. 1 from the direction of arrow B of FIG. 1, and FIG. 5 is an enlarged sectional view of region C of FIG. 4.

The semiconductor device of this embodiment is SiP (System in Package) which formed one system as a whole by mounting semiconductor components 2 and 3 with which package structure differs on one interposer substrate (substrate) 1.

Interposer substrate 1 is formed, for example with the printed-circuit board of the multilayer interconnection structure having six layers. The insulating layer of interposer substrate 1 includes, for example glass epoxy resin, and the wiring includes, for example copper (Cu). Interposer substrate 1 has the main surface (first surface) and back surface (second surface) which become the opposite side mutually along the thickness direction. The plane shape of the main surface and back surface of interposer substrate 1 is square shape, for example, and the vertical and horizontal dimension D1 and D2 is about 23 mm, for example. Thickness D3 (refer to FIG. 3) of interposer substrate 1 is about 1.1 mm, for example.

On the main surface of this interposer substrate 1, one semiconductor component (first semiconductor component) 2 and two semiconductor components (second semiconductor components) 3 are mounted. Semiconductor component 2 at the side of the upper row of FIG. 1 is arranged mostly in the center of the horizontal direction of FIG. 1. The plane sizes of semiconductor components 2 are about 7.27 mm×7.24 mm, for example. Logic circuits, such as a microprocessor, are formed in this semiconductor component 2, for example. Under-filling 4a made to intervene between the facing surfaces of semiconductor component 2 and interposer substrate 1 overflows into the periphery of semiconductor components 2, and a part of peripheral side face of semiconductor components 2 is covered.

On the other hand, along the horizontal direction of FIG. 1, two semiconductor components 3 at the side of the lower row of FIG. 1 are arranged, being located in a line. The plane size of each semiconductor component 3 is larger than the plane size of the above-mentioned semiconductor component 2, for example, are about 10 mm×12 mm. For example, memory circuits, such as DDR (Double Data Rate) SDRAM (Synchronous Dynamic Random Access Memory) of the memory capacity of 512 Mbit (megabit), are formed in each of these two semiconductor components 3. These two semiconductor components 3 are arranged so that they may become the equal distance from the above-mentioned semiconductor component 2 mutually. Hereby, the data transfer rate between the microprocessor of semiconductor component 2 and DDR SDRAM of each semiconductor component 3 becomes equal. Under-filling 4b made to intervene between the facing surfaces of each semiconductor component 3 and interposer substrate 1 overflows into the periphery of each semiconductor component 3, and a part of peripheral side face of semiconductor components 3 is covered. As for this under-filling 4b, different thing from under-filling 4a currently used by the above-mentioned semiconductor component 2 side is used like the after-mentioned. The mold of the semiconductor components 2 and 3 is not made, but they are exposed outside.

On the back surface of interposer substrate 1, bump electrodes (third bump) 5 of plurality (for example, 484 pieces) are arranged. Contiguity pitch (distance from the center to the center of bump electrode 5 which adjoins mutually) D4 (refer to FIG. 2) of these bump electrodes 5 of a plurality of is about 0.8 mm, for example. Distance D5 and D6 from bump electrode 5 of one end to bump electrode 5 of the other end of the horizontal direction and up-and-down direction of FIG. 2 is about 0.8×25=20 mm, for example. Height D7 (refer to FIG. 3 and FIG. 5) of bump electrode 5 is about 0.40 mm±0.05, for example, and diameter D8 (refer to FIG. 5) of bump electrode 5 is about 0.47 mm, for example. Thickness D9 (refer to FIG. 3) of the thickest part of the semiconductor device (length from the bottom face of bump electrode 5 to the upper surface of semiconductor components 3) is about 2.75 mm at the maximum, for example.

Each bump electrode 5 is formed, for example with unleaded solder, such as tin (Sn)-3 silver (Ag)-0.5 copper (Cu), or the solder of 37 lead (Pb)-63 tin (Sn). As shown in FIG. 5, it is joined to land 8a through opening by which opening was made to solder resist 6 of the back surface of interposer substrate 1, and is electrically connected. This land 8a is electrically connected with the above-mentioned multilayer interconnection of interposer substrate 1. Diameter D10 of land 8a is about 0.4 mm, for example.

The rear electrode of interposer substrate 1 may be made the so-called LGA (Land Grid Array) structure that has arranged the flat electrode pad in the shape of an array, replacing with bump electrode 5.

Figure 6:
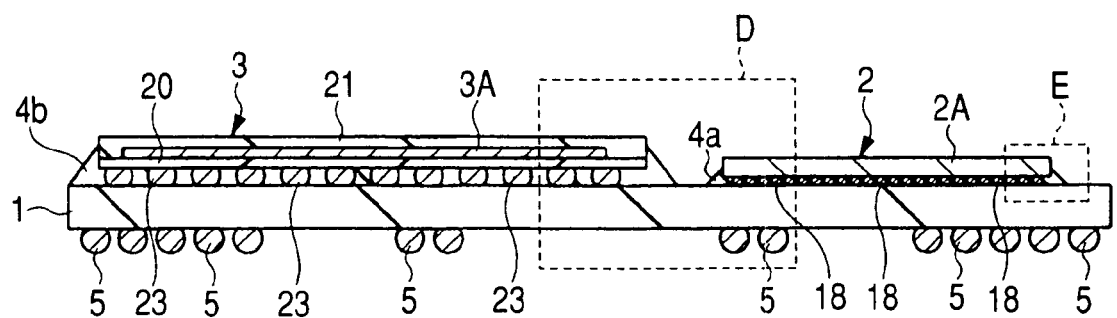
FIG. 6 is a sectional view of Y1 line-Y1 line of FIG. 1.
Figure 7:
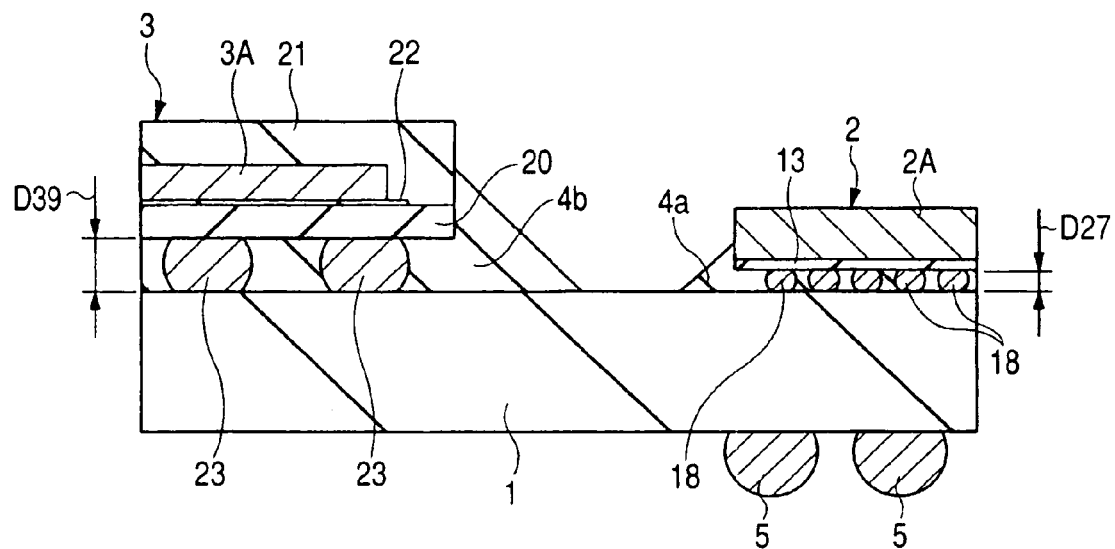
FIG. 7 is an enlarged sectional view of region D of FIG. 6.
Figure 8:
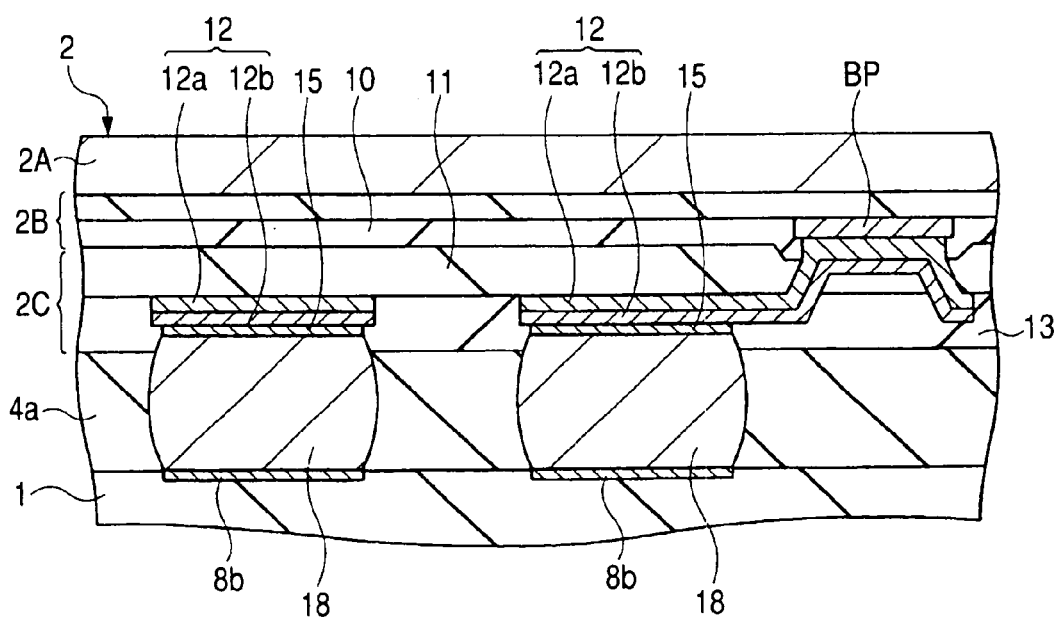
FIG. 8 is an enlarged sectional view of region E of FIG. 6.
Figure 9:
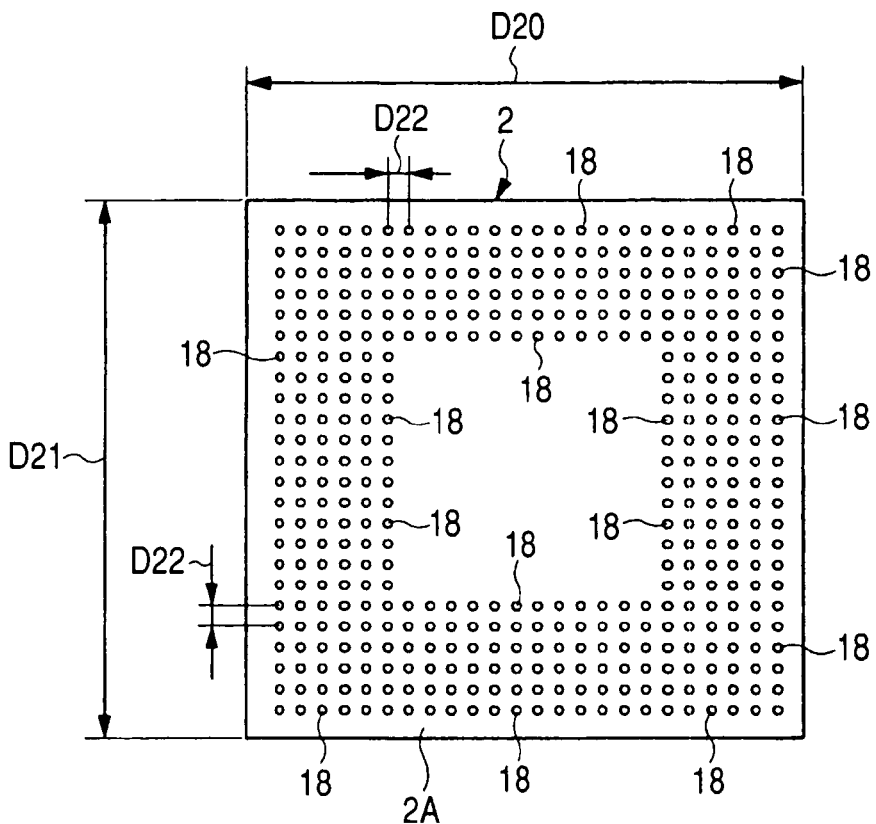
FIG. 9 is the whole main surface plan view of the first semiconductor component of FIG. 1.
Figure 10:
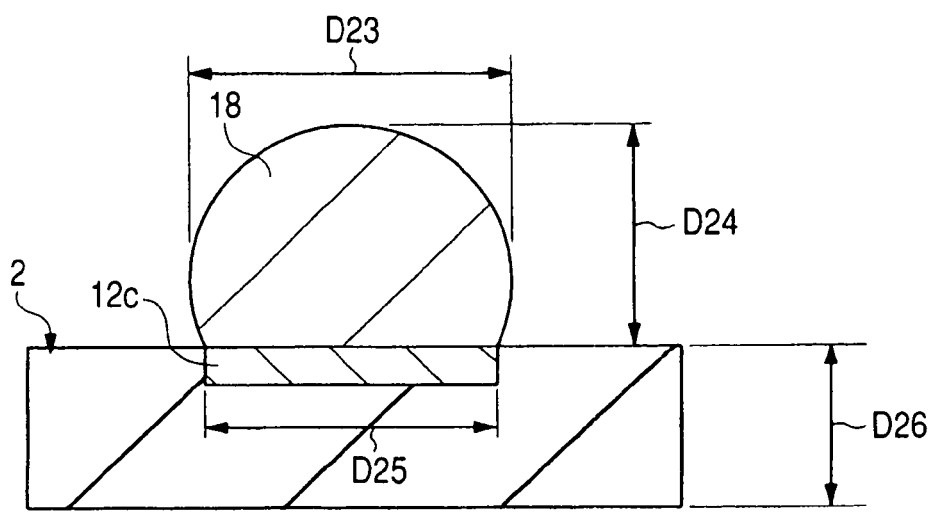
FIG. 10 is a principal part enlarged sectional view of a bump electrode and the neighborhood of the main surface of the first semiconductor component of FIG. 9.

Next, FIG. 6-FIG. 10 explain the above-mentioned semiconductor components 2 in detail. FIG. 6 is a sectional view of Y1 line-Y1 line of FIG. 1, FIG. 7 is an enlarged sectional view of region D of FIG. 6, FIG. 8 is an enlarged sectional view of region E of FIG. 6, FIG. 9 is the whole main surface plan view of semiconductor component 2, and FIG. 10 is a principal part enlarged sectional view of a bump electrode and the neighborhood of the main surface of semiconductor components 2 of FIG. 9.

Semiconductor component 2 is a semiconductor component of WPP (Wafer Process Package) structure. Namely, after forming a plurality of semiconductor chips through a usual element formation step and a usual multilayer interconnection layer forming step in the main surface of a semiconductor wafer (henceforth a wafer), while forming a re-wiring through a rewiring layer forming step on the main surface of the wafer, packaging is performed, and semiconductor component 2 is formed by cutting down each semiconductor chip from the wafer through a dicing step after that further.

Such semiconductor component 2 has semiconductor chip (henceforth a chip; first semiconductor chip) 2A, multilayer interconnection layer (wiring layer) 2B formed on the main surface of chip 2A, and rewiring layer 2C formed on multilayer interconnection layer 2B, as shown in FIG. 8.

Chip 2A includes a thin plate of silicon (Si) single crystal of n type or p type of plane rectangular shape, for example. Superficial dimension D20 (refer to FIG. 9) of chip 2A is about 7.24 mm, for example, and dimension D21 is about 7.27 mm, for example. An element like MIS•FET(Metal Insulator Semiconductor Field Effect Transistor) is formed in the active region surrounded by an isolation part of the main surface of this chip 2A, for example. The coefficient of thermal expansion of chip 2A is about 3 ppm, for example.

The above-mentioned multilayer interconnection 2B is formed by that an insulating layer and a wiring accumulate by turns along the thickness direction (direction which intersects perpendicularly with the main surface of chip 2A) of chip 2A. This insulating layer is formed, for example with the silicon oxide ($SiO_2$) or the silicon nitride ($Si_3N_4$). The wiring is formed, for example with aluminum (Al), tungsten (W), or copper (Cu). The above-mentioned logic circuit is formed in the main surface of chip 2A by electrically connecting desired elements with this wiring. Passivation film 10 is formed in the top layer of multilayer interconnection layer 2B. Passivation film 10 includes, for example the simple substance film of a silicon oxide film, or the laminated film by which the silicon nitride film was stacked in layers on the silicon oxide film. Opening is formed in a part of this passivation film 10, and bonding pad (henceforth pad) BP is exposed from there. Pad BP is electrically connected with the above-mentioned logic circuit through the wiring of multilayer interconnection layer 2B.

The above-mentioned rewiring layer 2C has insulating layer 11 deposited so that passivation film 10 might be covered, re-wiring 12 formed on insulating layer 11, and passivation film 13 deposited so that re-wiring 12 might be covered on insulating layer 11. Insulating layer 11 and passivation film 13 include, for example polyimide system resin. Re-wiring 12 has a function which pulls out pad BP to the wide region within the main surface of chip 2A, in order to take matching on the dimension of fine pad BP and a big bump electrode. Re-wiring 12 is electrically connected with above-mentioned pad BP through opening by which opening was made to insulating layer 11. Re-wiring 12 has the laminated constitution of the main conductor film 12a, and plated layer 12b. The main conductor film 12a which touches insulating layer 11 includes copper (Cu), for example, and plated layer 12b which touches the main conductor film 12a includes nickel, for example. Opening that a part of plated layer 12b of re-wiring 12 is exposed is formed in a part of passivation films 13, and plated layer 15 which includes gold (Au), for example is given to the exposure of the plated layer 12b. Bump electrode (first bump) 18 is joined to this plated layer 15. That is, bump electrode 18 is electrically connected with pad BP through re-wiring 12, and is electrically further connected with the above-mentioned logic circuit through the wiring of multilayer interconnection layer 2B. The side surface portion and back surface of chip 2A are exposed.

Such semiconductor component 2 is mounted on the main surface of interposer substrate 1 via the above-mentioned bump electrode 18, as shown in FIG. 6-FIG. 8. Bump electrode 18 includes unleaded solder like Sn-1Ag-0.5Cu, for example and is shown in FIG. 9, a plurality of (for example, 432 pieces) pieces are arranged on the main surface of chip 2A. Contiguity pitch D22 of bump electrode 18 is about 0.26 mm, for example. Diameter D23 (refer to FIG. 10) of each bump electrode 18 is about 0.11 mm, for example, and height D24 is about 0.08 mm, for example. Diameter D25 of land 12c of re-wiring 12 is about 0.1 mm, for example. The total thickness D26 of semiconductor components 2 is about 0.28 mm or 0.4 mm, for example.

As mentioned above, between the facing surfaces of semiconductor component 2 and interposer substrate 1, since bump electrode 18 intervenes, the gap of dimension D27 (refer to FIG. 7) is formed. Dimension D27 is about 40 μm, for example. And the above-mentioned under-filling 4a is filled up between the facing surfaces of this semiconductor components 2 and interposer substrate 1. That is, under-filling 4a is filled up between adjoining bump electrodes 18 in the state in contact with bump electrode 18, the above-mentioned passivation film 13 (for example, polyimide system resin) of semiconductor component 2, and the main surface of interposer substrate 1.

Such under-filling 4a is formed by base material like epoxy system resin being added by a curing agent and a filler, for example. As a curing agent, amine is used, for example. The amount of a filler is about 62wt %. Glass transition temperature Tg of under-filling 4a is 140° C., for example, Young's moduli E1 are 9 GPa, for example, and coefficient of thermal expansion a is 30 ppm or 90 ppm, for example.

Thus, by having been filled up with the above-mentioned under-filling 4a between the facing surfaces of semiconductor component 2 of WPP structure, and interposer substrate 1, the damage and the wiring disconnection failure resulting from the stress concentration in bump electrode 18 of semiconductor components 2 of WPP structure, or the short circuit defect resulting from a solder flush can be suppressed or prevented. That is, the reliability in bump electrode 18 of semiconductor components 2 of WPP structure can be improved.

Figure 11:
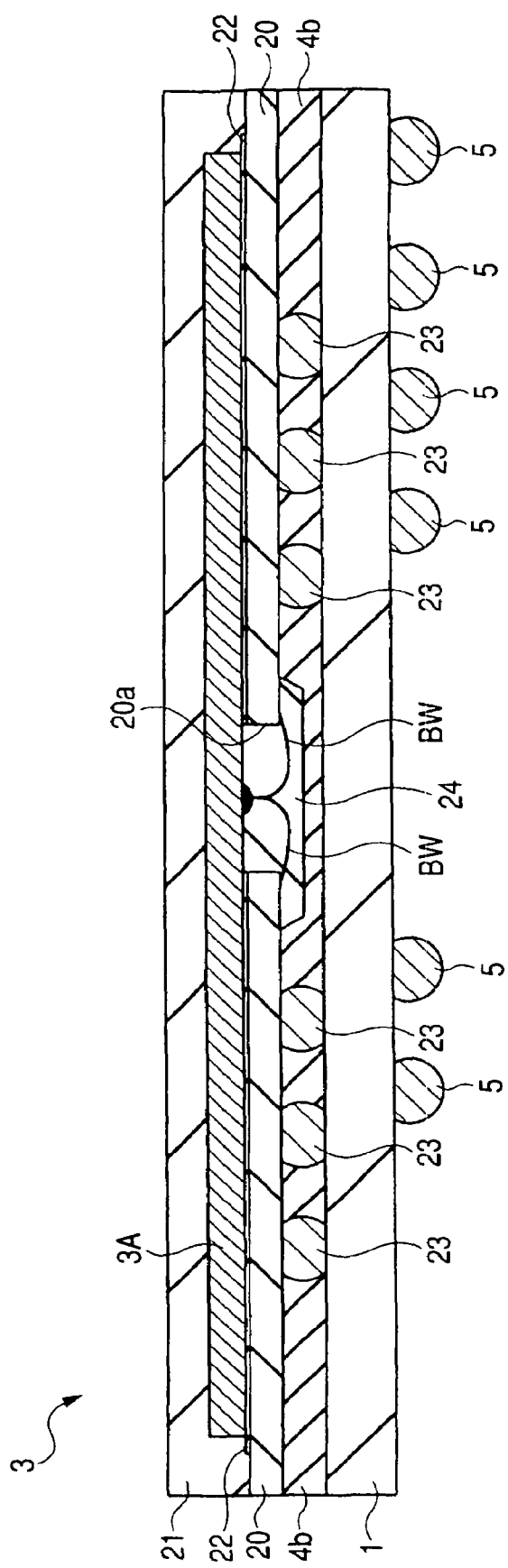
FIG. 11 is a sectional view of X1 line-X1 line of FIG. 1.
Figure 12:
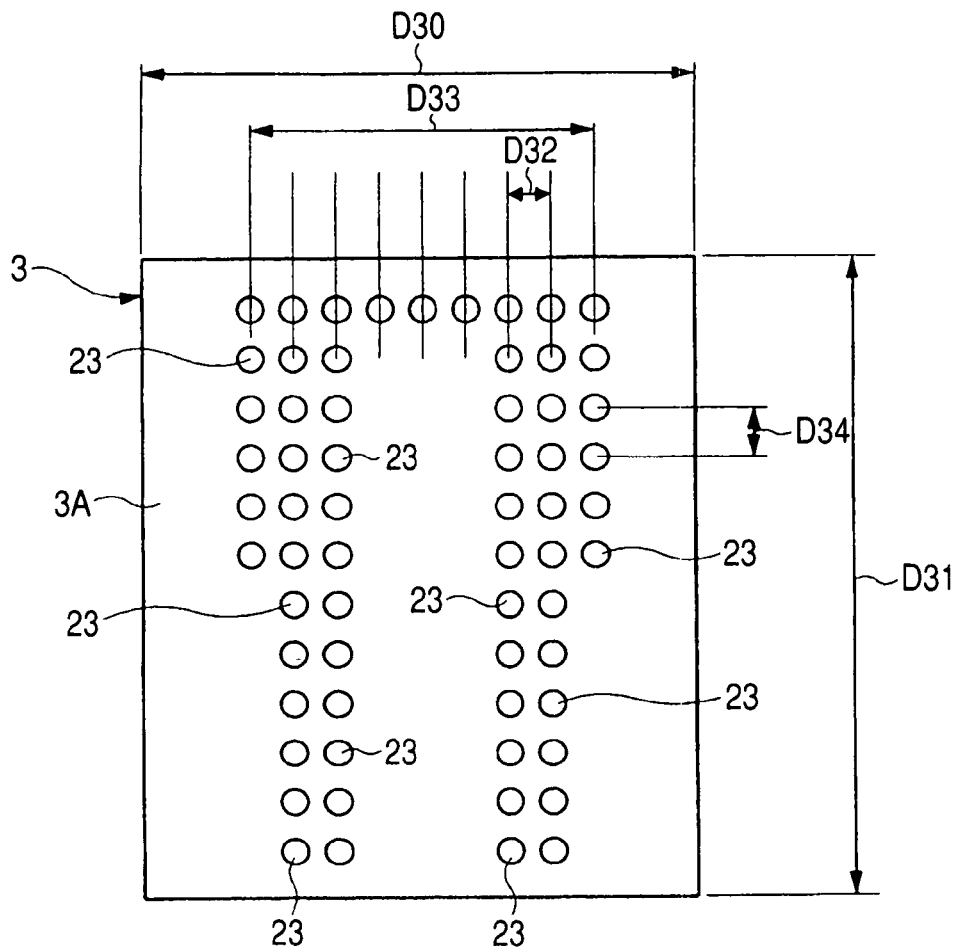
FIG. 12 is the whole main surface plan view of the second semiconductor component.
Figure 13:
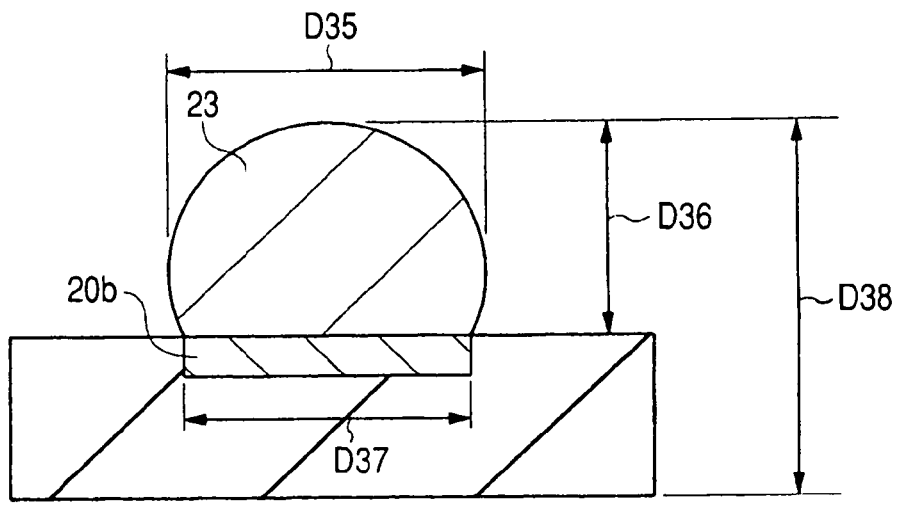
FIG. 13 is a principal part enlarged sectional view of a bump electrode and the neighborhood of the main surface of the second semiconductor component of FIG. 12.

Next, FIG. 6, FIG. 7 and FIG. 11-FIG. 13 explain the above-mentioned semiconductor components 3 in detail. FIG. 11 is a sectional view of X1 line-X1 line of FIG. 1, FIG. 12 is the whole main surface plan view of semiconductor components 3, and FIG. 13 is a principal part enlarged sectional view of a bump electrode and the neighborhood of the main surface of semiconductor component 3 of FIG. 12.

Semiconductor components 3 are semiconductor components of CSP (Chip Size Package) structure. That is, semiconductor components 3 are considered as package structure with that it is equivalent to chip size, or slightly big plane size. Such semiconductor components 3 have chip (second semiconductor chip) 3A, the multilayer interconnection layer formed on the main surface of chip 3A, wiring substrate 20 that mounts chip 3A, and resin seal part 21 which seals chip 3A, as shown in FIG. 11.

Chip 3A includes a thin plate of silicon (Si) single crystal of n type or p type of plane rectangular shape, for example. Superficial dimension D30 (refer to FIG. 12) of chip 3A is about 10 mm, for example, and dimension D31 is about 12 mm, for example. A plurality of MIS-FET and an element like a memory cell are formed in the main surface of this chip 3A, for example. The above-mentioned multilayer interconnection layer is formed on the main surface of chip 3A. The structure of this multilayer interconnection layer is the same as the above-mentioned chip 2A explained. The above-mentioned memory circuit is formed in the main surface of chip 3A by electrically connecting desired elements with the wiring of this multilayer interconnection layer. Opening is formed in a part of passivation films of the top layer of this multilayer interconnection layer, and the pad is exposed from there. This pad is electrically connected with the above-mentioned memory circuit through the wiring of a multilayer interconnection layer. There is no rewiring layer explained with the above-mentioned chip 2A in chip 3A.

Chip 3A is adhered on wiring substrate 20 via adhesion sheet 22, where the main surface is turned to the back surface of wiring substrate 20. Wiring substrate 20 is formed with the printed-circuit board of multilayer interconnection structure. Opening 20a which penetrates between the main and back surfaces is formed in the center of a plane of wiring substrate 20, and a plurality of pads of the above-mentioned chip 3A are exposed from the opening 20a. The pad of chip 3A is electrically connected to the electrode of the main surface of wiring substrate 20 via bonding wire (henceforth a wire) BW. The electrode of the main surface of this wiring substrate 20 is electrically connected to a plurality of lands 20b (refer to FIG. 13) arranged through the wiring of wiring substrate 20 in the main surface of wiring substrate 20. Bump electrode (second bump) 23 is joined to these lands 20b of a plurality of, and it electrically connects with them. That is, bump electrode 23 is connected with wire BW through land 20b of wiring substrate 20, a wiring, and an electrode, is connected with the pad of chip 3A, and a wiring through this wire BW, and is electrically connected to the above-mentioned memory circuit of chip 3A. Wire BW, the pad to which it is connected, etc. are sealed by resin seal part 24 which includes epoxy system resin, for example. The side surface and back surface of chip 3A are sealed by resin seal part 21 which includes epoxy system resin, for example. The coefficient of thermal expansion of wiring substrate 20 is about 10-20 ppm, for example.

Such semiconductor components 3 are mounted on the main surface of interposer substrate 1 via the above-mentioned bump electrode 23, as shown in FIG. 6, FIG. 7, and FIG. 11. Bump electrode 23 includes unleaded solder like Sn-3Ag-0.5Cu, for example, and as shown in FIG. 12, it is arranged in plurality (for example, 60 pieces) on the main surface of semiconductor components 3. Contiguity pitch D32 of bump electrode 23 in the short direction of semiconductor components 3 is about 0.8 mm, for example, and dimension D33 between bump electrodes 23 from an end portion to an end portion of the short direction of semiconductor components 3 is about 0.8×8=6.4 mm, for example. Contiguity pitch D34 of bump electrode 23 in the long-side direction of semiconductor components 3 is about 1.0 mm, for example. Diameter D35 (refer to FIG. 13) of each bump electrode 23 is larger than diameter D23 of bump electrode 18 of the above-mentioned semiconductor components 2, for example, is about 0.45 mm. Height D36 (refer to FIG. 13) of each bump electrode 23 is larger than height D24 of bump electrode 18 of the above-mentioned semiconductor components 2, for example, is about 0.36 mm. Diameter D37 of land 20b of wiring substrate 20 is about 0.4 mm, for example. The total thickness D38 of semiconductor components 3 is thicker than the total thickness of semiconductor components 2, for example, is about 1.2 mm at the maximum.

As mentioned above, between the facing surfaces of semiconductor components 3 and interposer substrate 1, since bump electrode 23 intervenes, the gap of dimension D39 (refer to FIG. 7) is formed. Dimension D39 of the gap between the facing surfaces of this semiconductor components 3 and interposer substrate 1 is larger than dimension D27 of the gap between the facing surfaces of the above-mentioned semiconductor components 2 and interposer substrate 1, for example, is about 280 μm. And the above-mentioned under-filling 4b is filled up between the facing surfaces of this semiconductor components 3 and interposer substrate 1. That is, under-filling 4b is filled up between adjoining bump electrodes 23 in the state in contact with bump electrode 23, the solder resist (for example, epoxy system resin) of the main surface of the above-mentioned wiring substrate 20 of semiconductor components 3, and the main surface of interposer substrate 1.

Although such under-filling 4b is formed by base material like epoxy system resin being added by curing agents (amine etc.) and a filler, for example like under-filling 4a filled up between the facing surfaces of the above-mentioned semiconductor component 2 and interposer substrate 1, what is different in the above-mentioned under-filling 4a is used. The amount of the filler of under-filling 4b is about 60 wt %, for example. Glass transition temperature Tg of under-filling 4b is 151° C., for example, and Young's moduli E1 are 7.1 GPa, for example. Coefficient of thermal expansion a of under-filling 4b is larger than the coefficient of thermal expansion of the above-mentioned under-filling 4a, for example, is 38 ppm or 102 ppm. What has the adhesive strength of under-filling 4b higher than that of under-filling 4a to the solder resist of the main surface of wiring substrate 20 is used.

Thus, by having filled up the above-mentioned under-filling 4b with this embodiment between the facing surfaces of semiconductor components 3 of CSP structure, and interposer substrate 1, the damage and the wiring disconnection failure resulting from the stress concentration in bump electrode 23 of semiconductor components 3 of CSP structure can be suppressed or prevented.

When filled up with under-filling 4a filled up between the facing surfaces of the above-mentioned semiconductor component 2 whose package structure is different from semiconductor components 3, and interposer substrate 1 between the facing surfaces of semiconductor components 3 and interposer substrate 1, for example, originating in the heat treatment for mounting the semiconductor device on a mother board via bump electrode 5, under-filling 4a between the facing surfaces of semiconductor components 3 and interposer substrate 1 may peel, and solder flush may occur. Since the melt temperature of bump electrode 5 becomes high when unleaded solder is being used especially as a material of bump electrode 5, the problem of the above-mentioned solder flush becomes remarkable. On the other hand, between the facing surfaces of semiconductor components 3 of the CSP structure from this embodiment, and interposer substrate 1, by having been filled up with under-filling 4b with characteristics which are different in the above-mentioned under-filling 4a, such as the coefficient of thermal expansion and the adhesive strength to the solder resist of the main surface of wiring substrate 20 being higher than the above-mentioned under-filling 4a, the short circuit defect between contiguity bump electrodes 23 resulting from the above-mentioned solder flush can be suppressed or prevented. That is, the reliability in bump electrode 23 of semiconductor components 3 of CSP structure can be improved. Therefore, according to this embodiment, the reliability of the semiconductor device which has semiconductor components 2 and 3 of different package structure mounted on the same surface of the same interposer substrate 1 via bump electrodes 18 and 23 with which height differs can be improved.

Figure 14:
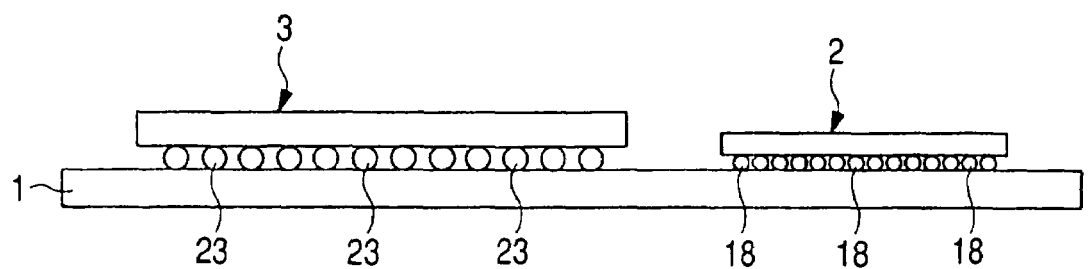
FIG. 14 is a side view in the assembly process of the semiconductor device of FIG. 1.
Figure 15:
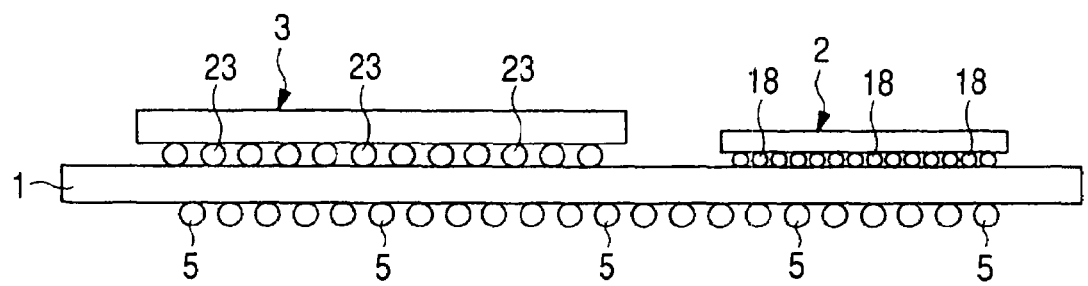
FIG. 15 is a side view in the assembly process of a semiconductor device following FIG. 14.
Figure 16:
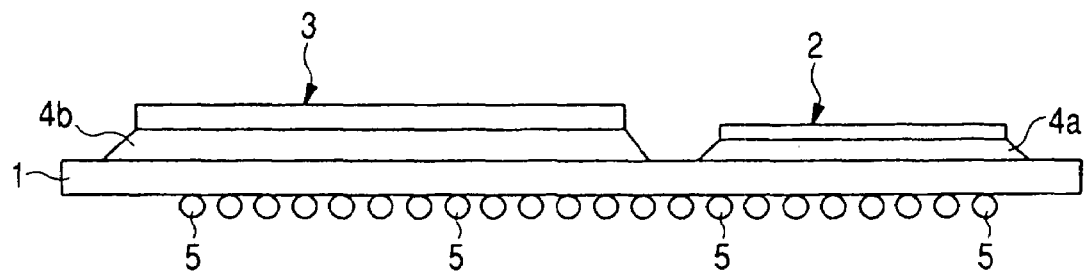
FIG. 16 is a side view in the assembly process of the semiconductor device following FIG. 15.
Figure 17:
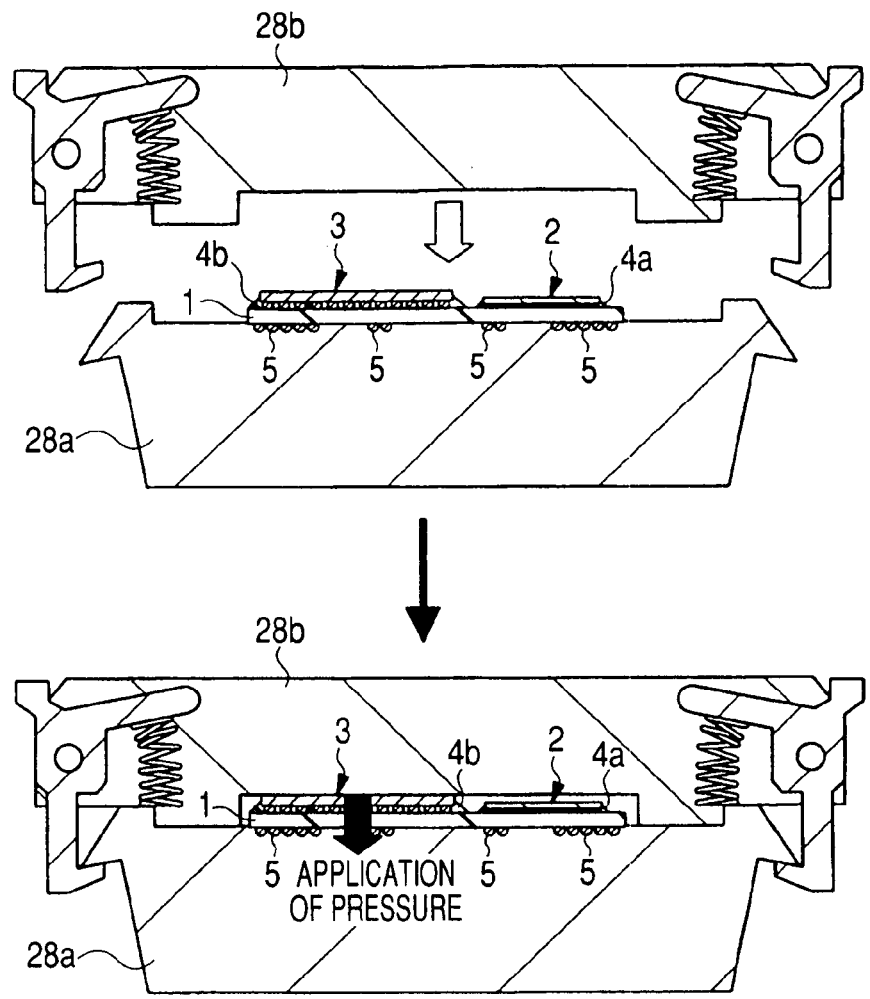
FIG. 17 is explanatory drawing at the time of the screening step of the assembly process of the semiconductor device of FIG. 1.
Figure 18:
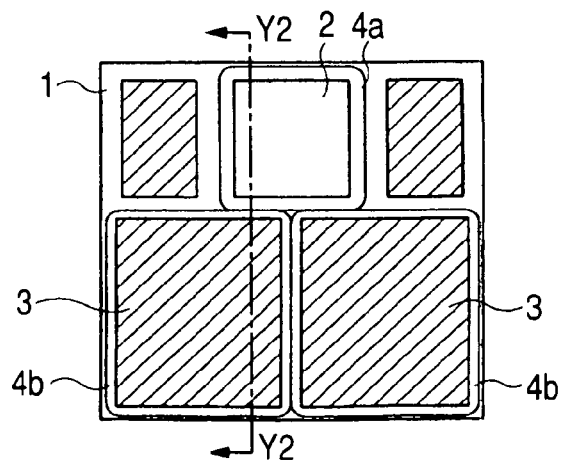
FIG. 18 is the whole main surface plan view of the semiconductor device at the time of the screening step of FIG. 17.

Next, FIG. 14-FIG. 19 explain an example of the assembly method of the semiconductor device of this embodiment. FIG. 14-FIG. 16 are the side views in the assembly process of the semiconductor device of this embodiment, FIG. 17 is explanatory drawing at the time of the screening step of the assembly process of the semiconductor device of this embodiment, and FIG. 18 is the whole main surface plan view of the semiconductor device at the time of the screening step of FIG. 17.

First, as shown in FIG. 14, semiconductor components 2 and 3 are mounted on the main surface of interposer substrate 1. After making alignment of bump electrodes 18 and 23 of semiconductor components 2 and 3, and the land of interposer substrate 1 and mounting semiconductor components 2 and 3 on the main surface of interposer substrate 1 at this step, by heat-treating, bump electrodes 18 and 23 are melted and joined to the land of the main surface of interposer substrate 1.

Then, after putting a solder ball on the land of the back surface of interposer substrate 1, by performing a heat treatment, a solder ball is melted and joined to the land of the back surface of interposer substrate 1. This forms a plurality of bump electrodes 5 on the back surface of interposer substrate 1, as shown in FIG. 15.

Then, after performing washing treatment etc., as shown in FIG. 16, under-filling 4a and 4b are filled up between the facing surfaces of semiconductor components 2 and 3 and interposer substrate 1. At the time of injection of under-filling 4a and 4b, interposer substrate 1 is heated, for example at the temperature of about 120° C with a hot plate. Hereby, the fluidity of under-filling 4a and 4b can be improved. Then, under-filling 4a and 4b are cured by heat-treating at desired temperature (baking processing).

Subsequently, after using a laser etc. for interposer substrate 1 or semiconductor components 2 and 3 and attaching a mark etc., it shifts to the screening step of the semiconductor device. At a screening step, as shown in the upper row of FIG. 17, lid 28b of socket 28a of a screening testing device is opened, socket 28a is equipped with a semiconductor device, and bump electrode 5 of a semiconductor device is electrically connected to the socket electrode of socket 28a.

Then, as shown in the lower row of FIG. 17, lid 28b of socket 28a is shut firmly. At this time, as shown in the upper row of FIG. 17, and FIG. 18, lid 28b hits the upper surface (back surface) of semiconductor components 3 of a semiconductor device, and comes to push semiconductor components 3, but by filling up with under-filling 4b between the facing surfaces of semiconductor components 3 and interposer substrate 1, bump electrode 23, and the wiring portion opposite to this can be protected from the mechanical force. Hatching was given to the portion to which lid 28b touches in FIG. 18. FIG. 17 shows the cross section of the part corresponding to Y2-Y2 line of FIG. 18.

Then, in the state which equipped socket 28a with the semiconductor device, a burn-in test is done to the semiconductor device, for example under the high temperature about 125° C., and the quality of the semiconductor device is judged. By the way, about semiconductor component 3 of CSP structure, since a screening step may be first performed to its simple substance, where only semiconductor component 2 of WPP structure is mounted on the main surface of interposer substrate 1, the above-mentioned screening test can also be done in that case. However, since becoming the state where the land to which bump electrode 23 of semiconductor components 3 of CSP structure is joined is exposed in the main surface of interposer substrate 1 in the case, the front surface of the land is oxidized at the time of a burn-in test. When semiconductor components 3 are mounted on the main surface of interposer substrate 1, there is a case where it becomes impossible to join bump electrode 23 well. On the other hand, in this embodiment, since the above-mentioned screening test is done after mounting semiconductor components 2 and 3 on the main surface of interposer substrate 1, it is avoidable that the above trouble occurs. Therefore, the yield and reliability of a semiconductor device can be improved. Thus, the semiconductor device shown in FIG. 1 etc. is assembled.

Figure 19:
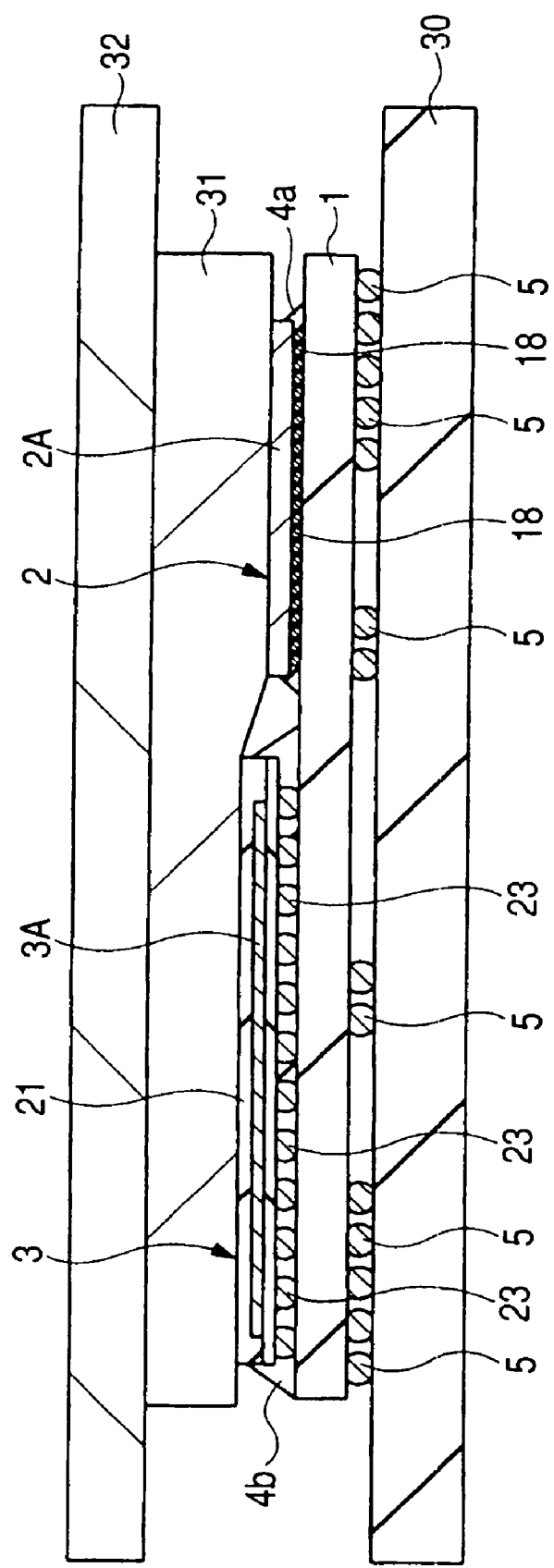
FIG. 19 is a sectional view of an example after mounting of the semiconductor device of FIG. 1.

Next, FIG. 19 is a sectional view of an example after assembling of the semiconductor device. The semiconductor device of this embodiment is mounted on the main surface of mother board 30 via bump electrodes 5. The treatment temperature at the time of mounting of a semiconductor device is about 260° C., for example, and processing time is about 20 seconds, for example. On this occasion, since the above-mentioned solder flush can be suppressed or prevented by having filled up the above-mentioned under-filling 4b with this embodiment between the facing surfaces of semiconductor components 3 of CSP structure, and interposer substrate 1, the short circuit defect between contiguity bump electrodes 23 resulting from solder flush can be suppressed or prevented.

On the upper surface of semiconductor components 2 and 3 of this semiconductor device, case 32 is installed via radiation sheet (radiator) 31. Radiation sheet 31 is in contact with the upper surface of sealing resin part 21 of semiconductor components 3 while it is in contact with the back surface of chip 2A of semiconductor component 2. The heat generated with semiconductor components 2 and 3 at the time of operation of the semiconductor device is radiated by case 32 via radiation sheet 31. Here, since the upper surface height is higher than the upper surface height of semiconductor component 2, semiconductor components 3 are strongly pushed from radiation sheet 31. However, in this embodiment, bump electrode 23, and the wiring portion opposite to this can be protected from the mechanical force by having been filled up with the above-mentioned under-filling 4b between the facing surfaces of semiconductor components 3 of CSP structure, and interposer substrate 1.

In the foregoing, the present invention accomplished by the present inventors is concretely explained based on above embodiments, but the present invention is not limited by the above embodiments, but variations and modifications may be made, of course, in various ways in the limit that does not deviate from the gist of the invention.

The present invention is applicable to the manufacturing industry of a semiconductor device.

What is claimed is:

1. A semiconductor device, comprising:
   a substrate having an upper surface and a lower surface opposing the upper surface;
   a first semiconductor component having a first main surface and a first back surface opposing the first main surface, and mounted over the upper surface of the substrate via a plurality of first bumps such that the first main surface of the first semiconductor component opposes to the upper surface of the substrate;
   a second semiconductor component having a second main surface and a second back surface opposing the second main surface, and mounted over the upper surface of the substrate via a plurality of second bumps such that the second main surface of the second semiconductor component opposes to the upper surface of the substrate;
   a first under-filling disposed between the first main surface of the first semiconductor component and the upper surface of the substrate;
   a second under-filling disposed between the second main surface of the second semiconductor component and the upper surface of the substrate; and
   a plurality of third bumps formed on the lower surface of the substrate;
   wherein a height of each of the plurality of second bumps is greater than that of each of the plurality of first bumps; and
   wherein a coefficient of thermal expansion of the second under-filling is greater than that of the first under-filling.

2. A semiconductor device according to claim 1, wherein materials of a portion which the under-filling contacts differ with the first semiconductor component and the second semiconductor component.

3. A semiconductor device according to claim 2, wherein a material of a portion to which the first under-filling contacts the first semiconductor component is polyimide system resin, and a material of a portion to which the second under-filling contacts the second semiconductor component is epoxy system resin.

4. A semiconductor device according to claim 1, wherein the first semiconductor component includes a first semiconductor chip, a wiring layer formed over a main surface of the first semiconductor chip, a rewiring layer formed over the wiring layer, and the first bumps electrically connected wit the rewiring layer; and
   the second semiconductor component includes a second semiconductor chip, a wiring layer formed over a main surface of the second semiconductor chip, a wiring substrate over which the second semiconductor chip is mounted, and to which the wiring layer of the second semiconductor chip is electrically connected, and the second bumps electrically connected to a wiring of the wiring substrate.

5. A semiconductor device according to claim 4, wherein a logic circuit is formed in the first semiconductor chip, and a memory circuit is formed in the second semiconductor chip.

6. A semiconductor device according to claim 1, wherein the first bumps, the second bumps, and the third bumps are formed with unleaded solder.

7. A semiconductor device according to claim 1, wherein the second under-filling is not in contact with the first under-filling.

8. A semiconductor device according to claim 7, wherein part of the second back surface of the second semiconductor component is exposed with respect to the second under-filling.

\* \* \* \* \*